United States Patent [19]

Nakamura

[11] Patent Number: 4,897,700

[45] Date of Patent: Jan. 30, 1990

[54] SEMICONDUCTOR MEMORY DEVICE

[75] Inventor: Kunio Nakamura, Tokyo, Japan

[73] Assignee: NEC Corporation, Tokyo, Japan

[21] Appl. No.: 205,871

[22] Filed: Jun. 13, 1988

[30] Foreign Application Priority Data

Jun. 12, 1987 [JP] Japan .................................. 62-146366

[51] Int. Cl.⁴ ........................ H01L 29/78; H01L 27/02
[52] U.S. Cl. ..................................... 357/23.6; 357/51; 357/41
[58] Field of Search ........................... 357/23.6, 51, 41

[56] References Cited

U.S. PATENT DOCUMENTS 4,419,743 12/1983 Taguchi et al. ..................... 357/23.6

FOREIGN PATENT DOCUMENTS 60-253265 12/1985 Japan .................................. 357/23.6
61-176148 8/1986 Japan .................................. 357/23.6
61-258467 11/1986 Japan .................................. 357/23.6

Primary Examiner—Joseph E. Clawson, Jr.
Assistant Examiner—Robert P. Limanek
Attorney, Agent, or Firm—Sughrue, Mion, Zinn, Macpeak & Seas

[57] ABSTRACT

A dynamic memory device of one-transistor memory cell type is disclosed. A thick insulating layer is formed on the transistor and an aperture is provided in the thick insulating layer to reach the source or drain region of the transistor. A MOS type storage capacitor is formed within the aperture and above the upper surface of the insulating layer such that the capacitance of the capacitor within the aperture becomes larger than the capacitance of the capacitor above the upper surface of the insulating layer.

4 Claims, 4 Drawing Sheets

SEMICONDUCTOR MEMORY DEVICE

BACKGROUND OF THE INVENTION

The present invention relates to a semiconductor memory device having a plurality of dynamic memory cells each composed of one switching transistor and one storage capacitor coupled to the transistor, and more particularly, to the capacitor structure thereof.

To enhance the capacitance of the storage capacitor with a high integration density, various types of the memory devices have been proposed. One type of device features a MOS type capacitor provided over the gate electrode of the transistor and connected to one of the source and drain regions of the transistor, and a digit line extends over the MOS capacitor and connected to the other of source and drain regions through a contact hole formed in an insulating layer. The structure, however, necessitates an adequateinterval between the contact hole and the gate electrode to prevent a short circuit between the gate electrode and the digit line within the contact hole, and it hinders the miniaturization of the device. To cope with the problem, a new memory device has been proposed by Masao Taguchi et al. in U.S. Pat. No. 4,419,743, in which a digit line is coupled to the upper electrode of the MOS type capacitor which is connected to one of source and drain regions of the transistor, and the other of source and drain regions is coupled to a reference potential line such as the $V_{DD}$ line or the ground line, as shown in its FIGS. 4 and 8A. The digit line is not connected to the source or drain region of the transistor, and therefore, the contact hole mentioned above is not necessary. The MOS type capacitor of the newly proposed memory device, however, depends mainly on an area over the transistor forming portion, that is, over the gate electrode of the transistor. Therefore, a sufficiently large capacitance of the MOS type capacitor cannot be obtained. Further, the MOS type capacitor is formed on an uneven surface of the insulating layer, obstructing reliable patterning of the upper electrode of the MOS type capacitor and of the digit line coupled to the upper electrode of the capacitor.

SUMMARY OF THE INVENTION

Accordingly, an object of the invention is to provide a semiconductor memory device in which a sufficiently large capactcance of the storage capacitor can be realized with a high integration density, and a reliable patterning of the upper electrode wiring layer can be expected.

According to a feature of the present invention, there is provided a semiconductor memory device which comprises a semiconductor substrate, a word line, a digit line, a reference potential line, a dynamic memory cell having one switching transistor and one storage capacitor connected to the switching transistor, and an insulating layer formed on the switching transistor. The switching transistor includes a pair of source and drain regions, a channel region positioned between the source and drain regions, a gate insulating film formed on the channel region and a gate electrode formed on the gate insulating film and coupled to the word line. One of the source and drain regions is coupled to the reference potential line. The insulating layer includes an upper surface and an aperture formed substantially perpendicular to the upper surface and reaching to a surface portion of the other of the source and drain regions to expose the surface portion. The storage capacitor includes a lower electrode formed on the side wall of the aperture, on the exposed surface portion of the other of the source and drain regions and on the upper surface of the insulating layer layer. In addition, the storage capacitor includes a dielectric film formed entirely on the lower electrode and an upper electrode formed on the dielectric film within the aperture and above the upper surface of the insulating layer to constitute a first MOS type capacitor within the aperture by the lower electrode, the dieletric film and the upper electrode and further includes a second MOS type capacitor above the upper surface of the insulating layer formed by the lower electrode, the dielectric film and the upper electrode. The capacitance of the first MOS type capacitor within the aperture is larger than the capacitance of the second MOS type capacitor above the upper surface of the insulating layer, and the upper electrode is coupled to the digit line. To obtain the capacitance of the first MOS type capacitor within the aperture higher than that of the second MOS type above the upper surface of the insulating layer, the thickness of the insulating layer is favorably 3 $\mu$m or more, and to form the perpendicular aperture surely the thickness is favorably 6 $\mu$m or less. Further, the upper surface of the insulating layer may be substantially coplanar such that the height difference between the highest surface part and the lowest surface part within a memory array section of the device in which a plurality of dynamic memory cells are formed, or within one memory cell area, is 0.1 $\mu$m or less. To realize further high integration, the digit line and the upper electrode of the storage capacitor may be continuously formed with a constant width. To enhance the capacitance of the storage capacitor furthermore, a trench may be formed in the insulating layer from the upper surface into a predetermined depth and a third MOS type capacitor may be formed within the trench by the lower electrode, the dielectric film and the upper electrode each provided within the trench. In this case, the third MOS type capacitor is added to the first and second MOS type capacitors to constitute the storage capacitor of the memory cell with the first and second MOS type capacitors.

DESCRIPTION OF THE PRIOR ART

Figure 1:
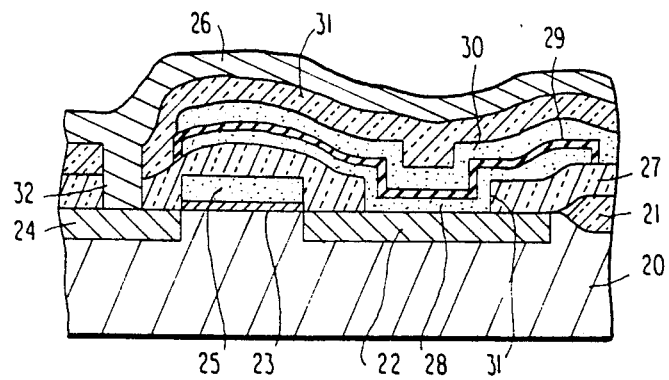
FIG. 1 is a cross-sectional view showing a semiconductor memory device of the prior art.
Figure 2:
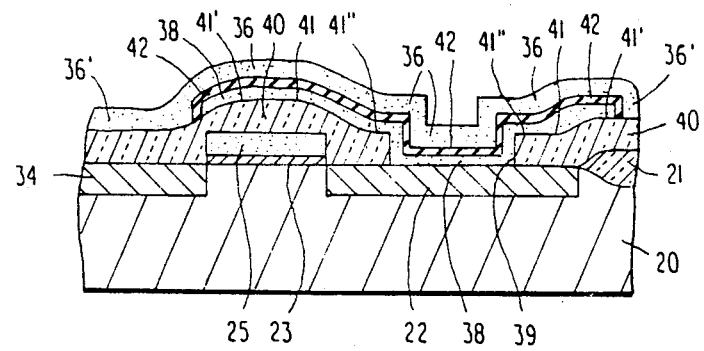
FIG. 2 is a cross-sectional view showing a semiconductor memory device in another piece of prior art.

Referring to FIG. 1, a conventional dynamic semiconductor memory device of one-transistor type will be explained. On a major surface of a P-type silicon substrate 20, a thick field insulating layer 21 made of silicon oxide is selectively formed, and one switching transistor is formed in an element forming region of the substrate. The transistor includes a pair of N-type impurity regions 22, 24 serving as source, drain regions of the transistor, a gate insulating film 23 on a channel region between the impurity regions 22, 24 and a polycrystalline silicon gate electrode 25 on the gate insulating film 23. A MOS type storage capacitor is constituted by a lower electrode 28 made of doped polycrystalline silicon, an upper electrode 30 made of doped polycrystalline silicon and a dielectric film 29 made of silicon oxide and/or silicon nitride and interposed by the upper and lower electrodes. The MOS type storage capacitor is connected to the N-type impurity region 22 of the transistor at the lower electrode 28 through a first contact hole 31 provided in a first insulating layer 27 having 0.5 to 1.0 μm thickness and made of CVD silicon oxide or phosphosilicate glass, and extends over the gate electrode 25 via the first insulating layer 27. Further, a second insulating layer 31 having 0.5 to 1.0 μm thickness and made of CVD silicon oxide or phosphosilicate glass is formed on the upper electrode 30 of the capacitor and on the first insulating layer, and a metalic digit line 26 made of aluminium extends on the second insulating layer 31 and connected to the N-type impurity region 24 through a second contact hole 32 provided in the first and second insulating layers 27, 31. The device necessitates the second contact hole 32 which must be apart from the gate electrode 25 to the extent of avoiding a short circuit between the gate electrode 25 and the digit line 26 in the contact hole 32, and therefore, a higher integrated circuit cannot be realized. In FIG. 2, the same components as those in FIG. 1 are indicated by the same reference numerals. In the device shown in FIG. 2, an N-type impurity region 34 serving as one of source and drain regionsof the switching transistor is coupled to a reference potential line such as the $V_{DD}$ line or the ground line, and a MOS type storage capacitor is constituted by a lower electrode 38 made of doped polycrystalline silicon connected to the N-type impurity region 22 through a contact hole 39 provided in an insulating layer 40 having the thickness of 0.5 to 1.0 μm and made of CVD silicon oxide or phosphosilicate glass and extending over the gate electrode 25 via the insulating layer 40, a dielectric film 42 made of silicon oxide and/or silicon nitride and formed on the lower electrode 38, and an upper electrode 36 made of doped polycrystalline silicon, formed on the dielectric film 42 and coupled continuously to a digit line 36' of the memory device. The memory device can eliminate the disadvantage shown in FIG. 1 because any contact hole connecting a digit line and an impurity region formed in the substrate is not necessary. However, with the conventional memory device in FIG. 2, it is still difficult to realize further high integration density of the memory device because the major capacitance of the storage capacitor is formed on the upper surface 41 of the insulating layer 40 and only a small amount of capacitance of the storage capacitor is formed within the contact hole 39 of the insulating layer 40. Moreover, the insulating layer 40 has the uneven upper surface 41 such that the level difference between the high surface portion 41' and the low surface portion 41" becomes 0.5 μm or more. Therefore, the digit line including the upper electrode of the storage capacitor cannot be reaiiably patterned. These disadvantages are caused by the thickness of the insulating layer 40 because the layer 40 is provided as an usual inter-ply or intermediate insulating layer which has generally 0.5 μm to 1.0 μm thickness.

DESCRIPTION OF EMBODIMENTS

Figure 3A:
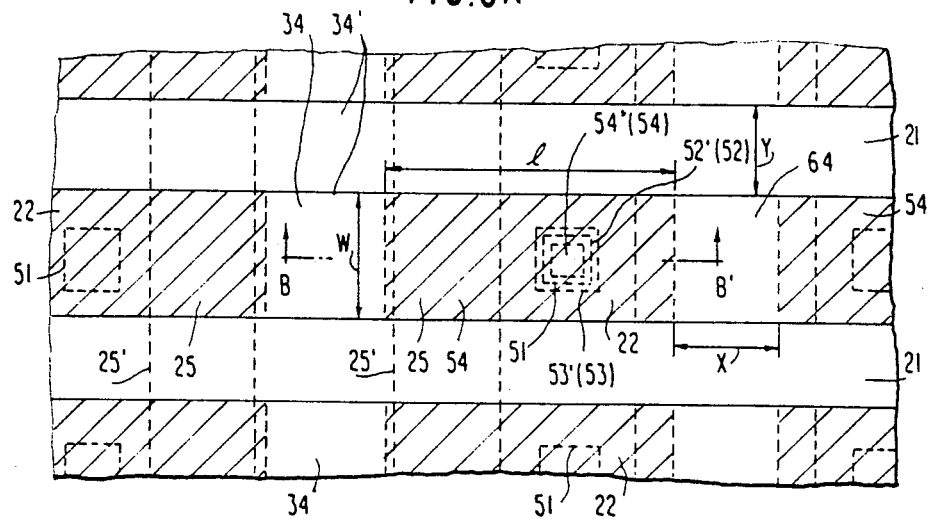
FIG. 3A is a plan view showing a first embodiment of the present invention.
Figure 3B:
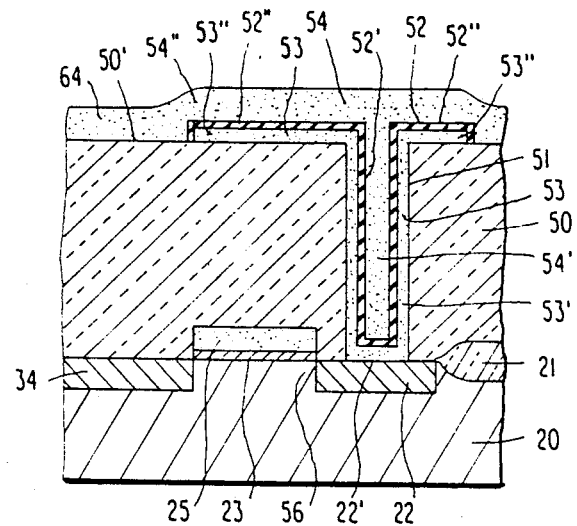
FIG. 3B is a cross-sectional view taken along line B—B' in FIG. 3A as viewed in the direction of arrows.

Referring to FIGS. 3A and 3B, a first embodiment of the present invention will be explained. Although a plurality of memory cells arranged in a matrix form are shown in FIG. 3A, only one memory cell is exemplified in FIG. 3B. Each of the memory cells comprises one switching transistor and one MOS type storage capacitor coupled to the transistor. Each transistor includes a pair of N-type impurity regions 34, 22 serving as source and drain regions and formed in a P-type silicon substrate 20. A gate insulating film 23 is provided and is formed on a channel region 56 between the impurity regions 34, 22, and a doped polycrystalline silicon gate electrode 25 is formed on the gate insulating film 23.

The N-type impurity region 34 is a part of an N-type impurity region 34' which is a reference potential line such as the $V_{DD}$ line or the ground line, and the gate electrode 25 is a part of a doped polycrystalline silicon layer 25' which is a word line. Both of the reference potential line 34' and the word line 25' extend in a first direction in the plane view as shown in FIG. 3A. A thick field insulating layer 21 is selectively formed in the major surface of the P-type substrate 20 and surrounds the respective channel regions 56, N-type impurity regions 22 and N-type impurity regions 34' including impurity regions 34. A thick insulating layer 50 having 3.0 μm thickness is entirely formed. The insulating layer 50 may be made of CVD silicon oxide or silicate glass such as phosphosilicate glass (PSG), borosilicate glass (BSG) or borophosphosilicate glass (BPSG). Owing to the thick thickness, the upper surface 50' becomes substantially co-planar such that the level difference between the highest portion thereof and the lowest portion thereof is 0.1 μm or less. A plurality of apertures 51 are formed in the thick insulating layer 50 from the upper surface 50' perpendicularly to the surface portions 22' of the N-type impurity regions 22 belonging to respective memory cells. Each of apertures 51 has a square plane shape of 1.0 μm×1.0 μm. Each MOS type storage capacitor includes a lower electrode 53 made of doped polycrystalline silicon, a dielectric film 52 formed on the lower electrode 53, and an upper electrode 54 formed on the dielectric film 52 and constituting a part of a digit line 64 made of doped polycrystalline silicon extending on the thick insulating layer 50 in a second direction at a right angle to the first direction. The lower electrode 53 consists of a first section 53' of the doped polycrystalline silicon having 0.1 μm thickness and provided on the four side walls of the aperture 51 perpendicular to the upper surface 50' and on the bottom of the aperture, that is, on the exposed surface portion 22' of the N-type impurity region 22 to connect to it, and a second section 53" of the doped polycrystalline silicon having 0.1 μm thickness and provided on the flat upper surface 50' of the thick insulating layer 50. The first and second sections 53', 53" of the lower electrode 53 of the storage capacitor are continuously formed. The dielectric film 52 consists of a first part 52' made of a silicon oxide film of 100 Å thickness, or a silicon nitride film of 200 Å thickness, or else a composite film by a silicon oxide film of 50 Å and a silicon nitride film of 100 Å and provided entirely on the first section 53' of the lower electrode 53 within the aperture 51, and a second part 52" made of the same material as and continuously formed with the first part 52' and provided entirely on the second section 53" of the lower electrode 53 above the flat upper surface 50' of the insulating layer 50. The upper electrode 54 made of doped polycrystalline silicon consists of a first portion 54' formed on the first part 52' of the dielectric film 52 within the aperture 51 and filling it, and a second portion 54" formed on the second part 52" of the dielectric film 52 above the flat upper surface 50' of the insulating layer 50. Therefore, the MOS type storage capacitor is constructed by a first MOS type capacitor formed by the first section 53' of the lower electrode 53, the first part 52' of the dielectric film 52 and the first portion 54' of the upper electrode 54 within the aperture 51, and a second MOS type capacitor formed by the second section 53" of the lower electrode 53, the second part 52" of the dielectric film 53 and the second portion 54" of the upper electrode 54 above the upper surface 50' of the insulating layer 50. The area of the storage capacitor including the first and second MOS type capacitors in each memory cell is represented by right-upwardly hatching in FIG. 3A. When a memory device is designed with high integration density, the plane area of the storage capacitor indicated by right-upwardly hatching in FIG. 3A has, for example, the length l of 4 $\mu$m and the width w of 2 $\mu$m, that is, the second section 53" of the lower electrode 53 has the plane shape with the second part 52" of the dielectric film 52 of 4 $\mu$m length and 2 $\mu$m width and the digit line 64 extend with the 2 $\mu$m width on the lower electrode and on the dielectric film. Further, the capacitor area is separated from adjacent capacitor areas belonging to other memory cells by, for example, X of 1 $\mu$m and Y of 1 $\mu$m. In this case, the capacitance of the first MOS type capacitor within the aperture 51 becomes 36.7 fF, and the capacitance of the second MOS type capacitor above the insulating layer 50 becomes 24.2 fF. Then, a storage capacitor having a large capacitance of 60.9 fF can be obtained with a small plane area of 4 $\mu$m$\times$2 $\mu$m. The value is large to maintain normal operation of a DRAM with a strong immunity against the soft error phenomenon by $\alpha$ particles. Whereas, if the insulating layer decreases its thickness to the conventional range of 0.5 $\mu$m to 1.0 $\mu$m, the capacitance by the first MOS capacitor within the aperture becomes lower than that of the second capacitor above the insulating layer. For example, when the thickness of 1 $\mu$m, the capacitance of the first MOS type capacitor within the aperture decreases to 17 fF which is lower than that of the second MOS type capacitor (24.2 fF), and total capacitance of the MOS storage capacitor in one memory cell becomes also low level of 41.2 fF. Therefore, in this case, the plane area of the storage capacitor must be enlarged to obtain the capacitor having a sufficiently large capacitance level by sacrificing the integrated density. The word line 25' and the reference potential line 34' may be led-out aft peripheral portions of the device by forming through-holes through the thick insulating layer 50 and filling them with conductive material such as doped polycrystalline silicon, tungsten silicide etc., respectively, by the CVD process.

Figure 4A:
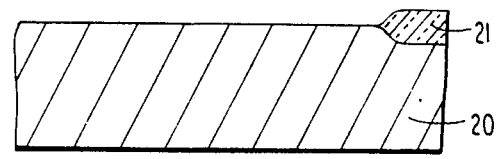
FIGS. 4A to 4D are cross-sectional view showing process steps in sequence for manufacturing the first embodiment.
Figure 4B:
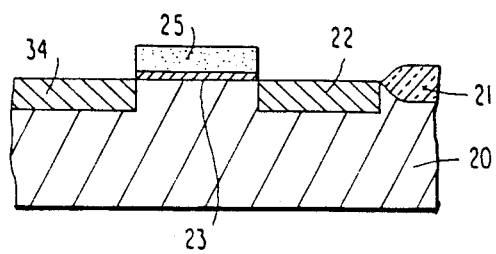
Figure 4C:
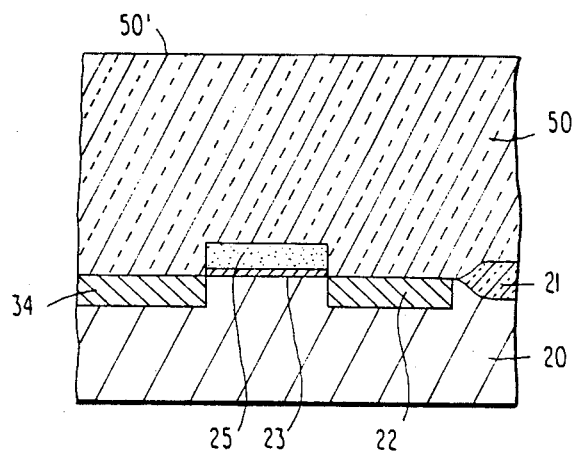
Figure 4D:
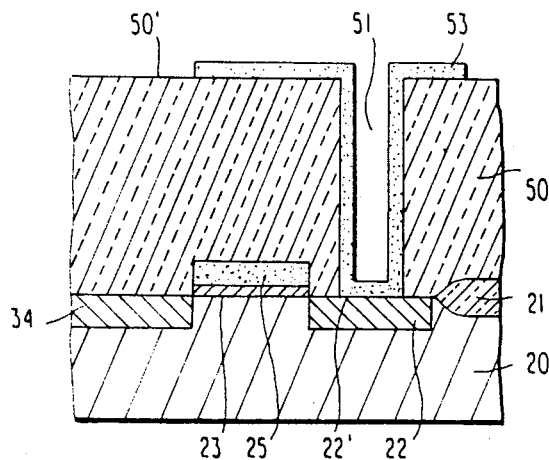

Referring to FIGS. 4A to 4D, a method of manufacturing the first embodiment will be exemplified. After forming the silicon oxide field insulating layer 21 of 0.5 $\mu$m thickness selectively on the major surface of the P-type silicon substrate 20 (FIG. 4A), a gate silicon oxide film 23, a doped polycrystalline silicon gate electrode 25 of 0.3 to 0.4 $\mu$m thickness is continuously formed with the word line. The N-type impurity region 22 and the N-type impurity region 34 which is a part of the reference potential line is formed by ion-implanting arsenic ions with 10 to 50 KeV energy and the dosage of $10^{15}$ to $10^{16}$/cm$^2$ density by using the gate electrode and the field insulating layer as the mask (FIG. 4B). The gate electrode and the word line may be made of metal silicide such as tungsten silicide or of a composite layer by a doped polycrystalline silicon film and a metal silicide film. Next as shown in FIG. 4C, the thick insulating layer 50 made of silicon oxide or silicate glass such as PSG is deposited by 3 to 4 $\mu$m through the CVD process. Owing to the thick thickness, the protrusion of the gate electrode is hardly affected by the upper surface 50' of the layer 50, and it becomes substantially co-planar. A thermal treatment of glass re-flowing may be conducted, if necessary. Next, as shown in FIG. 4D, the aperture 51 of 1 $\mu$m$\times$1 $\mu$m square plan shape is formed in the insulating layer 50 perpendicularly to the upper surface 50' to expose the surface part 22' of the N-type impurity region 22 through reactive anisotropic etching method by using a photo resist pattern (not shown) on the upper surface 50' as a mask. The polycrystalline silicon film 53 doped with N-type impurities and having 0.1 $\mu$m thickness is formed on the upper surface 50' of the insulating layer 50 selectively, on the side wall of the aperture 51 entirely and on the exposed surface part 22' to employ it as the lower electrode of the storage capacitor. Then, the dielectric film 52 is formed on the entire surface of the lower electrode 53, and the doped polycrystalline silicon layer is deposited by 1.0 $\mu$m thickness on the upper surface 50' of the insulating layer 50 and on the dielectric film 52 above the upper surface 50' and within the aperture 51 to fill the aperture. The doped silicon layer is shaped by a photo-resist process step to form the digit line 64 including the upper electrode 54 of the storage capacitor (FIGS. 3A, 3B). Thereafter, an insulating layer (not shown) of 0.5 to 1.0 $\mu$m is entirely formed, the lead-out means (not shown) mentioned above for leading out the word line and the reference potential line are performed, and aluminum electrodes (not shown) connected to both the lead-out means and to the digit line, respectively, are formed to complete the memory device.

Figure 5:
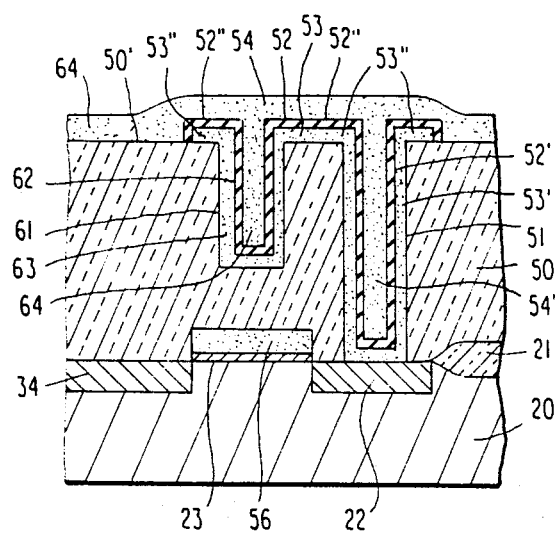
FIG. 5 is a cross-sectional view showing a second embodiment of the present invention.

Referring to FIG. 5, a second embodiment will be explained. In FIG. 5, the same components as those in FIGS. 3A and 3B are indicated by the same reference numerals. In addition to the aperture 51, a trench 61 is formed in the insulating layer above the gate electrode 56 but not reaching to the gate electrode, and a third MOS capacitor formed by a lower electrode 63 by the doped polycrystalline silicon, a dielectric film 62 on the lower electrode 63 and an upper electrode 64 by the doped polycrystalline silicon on the dielectric film 62, is formed in the trench 61. Therefore, the capacitance of the storage capacitor of the second embodiment is further increased.

What is claimed is:
1. A semicondutor memory device comprising a semiconductor substrate, a word line, a digit line, a reference potential line, a dynamic memory cell having one switching transistor and one storage capacitor connected to said switching transistor, and an insulating layer formed on said switching transistor, made of silicate glass and having a thickness ranging from 3 $\mu$m to 6 $\mu$m, said switching transistor including a pair of source and drain regions, a channel region positioned between said source and drain regions, a gate insulating film formed on said channel region and a gate electrode formed on said gate insulating film and coupled to said word line, one of said source and drain regions being coupled to said reference potential line, said insulating layer having a flat planar upper surface and an aperture formed substantially perpendicularly to said upper surface and reaching a surface portion of the other of said source and drain regions to expose said surface portion, and a trench formed from said upper surface into a predetermined depth at a position above said gate electrode such that between the bottom of said trench and said gate electrode a part of said insulating layer is interposed, and said storage capacitor including a lower electrode formed on the side wall of said aperture, on said exposed surface portion of said other of said source and drain regions on said upper surface of said insulating layer, and on said bottom and the side wall of said trench, a dielectric film formed entirely on said lower electrode and an upper electrode formed on said dielectric film within said aperture, above said upper surface of said insulating layer and within said trench to constitute a first MOS type capacitor within said aperture by said lower electrode, said dielectric film and said upper electrode, a second MOS type capacitor above said upper surface of said insulating layer by said lower electrode, said dielectric film and said upper electrode a third MOS type capacitor within said trench by said lower electrode, said dielectric film and said upper electrode, the capacitance of said first MOS type capacitor within said aperture being larger than the capacitance of said second MOS type capacitor above said upper surface of said insulating layer, and said upper electrode being coupled to said digit line.

2. A semiconductor memory device of claim 1, in which the height difference of said upper surface of said insulating layer between a highest part and a lowest part in one memory cell area is 0.1 μm or less.

3. A semiconductor memory device of claim 1, in which said digit line and said upper electrode are continuously formed by a doped polycrystalline silicon film.

4. A semiconductor memory device of claim 3, in which said doped polycrystalline silicon film is formed with a constant width on said upper surface of said insulating layer and within said aperture to formed said storage capacitor and to connect said storage capacitor to adjacent storage capacitors belonging to other memory cells.

* * * * *

UNITED STATES PATENT AND TRADEMARK OFFICE
CERTIFICATE OF CORRECTION

PATENT NO. : 4,897,700

DATED : January 30, 1990

INVENTOR(S) : Kunio Nakamura

It is certified that error appears in the above-identified patent and that said Letters Patent is hereby corrected as shown below:

Col. 1, line 19, delete "adequateinterval" and insert --adequate interval--;

Col. 2, line 11, delete "dieletric" and insert --dielectric--;

Col. 3, line 34, delete "regionsof" and insert --regions of--;

Col. 5, line 14, delete "53" and insert --52--;

Col. 5, line 54, delete "aft" and insert --at--.

Signed and Sealed this

Sixteenth Day of April, 1991

Attest:

HARRY F. MANBECK, JR.

*Attesting Officer*

*Commissioner of Patents and Trademarks*